(12) United States Patent
Yu et al.

(10) Patent No.: US 6,803,789 B1
(45) Date of Patent: Oct. 12, 2004

(54) HIGH VOLTAGE TOLERANT OUTPUT BUFFER

(75) Inventors: Ta-Lee Yu, Shanghai (CH); Paul H. Ou Yang, Santa Clara, CA (US)

(73) Assignee: Semiconductor Manufacturing International Corporation, Shanghai (CN)

( * ) Notice: Subject to any disclaimer, the term of this patent is extended or adjusted under 35 U.S.C. 154(b) by 103 days.

(21) Appl. No.: 10/265,283

(22) Filed: Oct. 4, 2002

(51) Int. Cl.$^7$ .......................................... H03K 19/0185
(52) U.S. Cl. .......................... 326/81; 326/83; 326/57; 326/27
(58) Field of Search .............................. 326/27, 80, 81, 326/83, 57, 58

(56) References Cited

U.S. PATENT DOCUMENTS

| | | | |
|---|---|---|---|
| 5,926,056 A | 7/1999 | Morris et al. ............... | 327/333 |
| 5,933,025 A | * 8/1999 | Nance et al. ................. | 326/81 |
| 5,966,026 A | * 10/1999 | Partovi et al. ................ | 326/27 |
| 6,043,680 A | 3/2000 | Dasgupta ..................... | 326/81 |

* cited by examiner

Primary Examiner—Don Le

(57) ABSTRACT

The present invention discloses a high voltage tolerant output buffer, which is compatible with a 5-volt input signal on its output node while operating with a 3.3-volt power supply. The high voltage tolerant output buffer includes a NAND gate, a NOR gate, a pair of pull-up transistors, a pair of pull-down transistors, a pair of enable transistors, an inhibit transistor, and a substrate bias circuit. The present invention overcomes the problems due to the degradation of gate-oxide integrity reliability and reduces the fabrication cost by minimizing the chip size.

19 Claims, 5 Drawing Sheets

HIGH VOLTAGE TOLERANT OUTPUT BUFFER

BACKGROUND OF THE INVENTION

1. Field of the Invention

The present invention relates, generally, to an output buffer with a high-impedance state and more particularly, to an output buffer capable of tolerating on its output voltages higher than its supply voltage.

2. Description of the Related Art

In the operation of a system utilizing integrated circuits (IC's) that operate at different power voltages, any IC that is fabricated for use with a given power voltage often interfaces with other IC's in the system in which other IC's operate at a different voltage. More particularly, it often occurs that a 5-V signal on a bus is supplied to the output pad of an IC with a 3.3-V power supply. It is therefore desirable that an output buffer, having a high-impedance state and powered from a supply in the 3.0 to 3.3 volt range, be capable of tolerating, at the output node, logic input signals exceeding the supply voltage, when the output buffer is in the high-impedance state.

A circuit of such a conventional output buffer 100 is shown in FIG. 1. In FIG. 1, IN 102 denotes a signal input, OE (Output Enable) 104 denotes a signal input for enabling the output and an output node 106, which provides an inverted version of the signal input IN 102, is connected to an output pad 108. Signal input 104 (OE, Output Enable) is connected to an active low input of an OR gate 110 and is connected to an input of AND gate 112. Node DP, the output of the OR gate 110, is connected to the gate of a p-channel transistor 118 (MP1). The p-channel transistor 118 has a channel between its source and drain nodes connected between the voltage supply 120 ($V_{DD}$, typically +3.3 volts) and output node 106. The substrate of the p-channel transistor is connected to Vdd 120. Node DN, the output of AND gate 112, is connected to the gate of an n-channel transistor 126 (MN1). The channel of the n-channel transistor 126 is connected between the output node 106 and the reference voltage 128 and the substrate of the n-channel transistor is connected to the reference voltage 128.

In accordance with the diagram illustrated in FIG. 1, the operation of the logic gates 110, 112 and the transistors MP1 118 and MN1 126 is next described. When the OE 104 signal is at logical low (or "0", disabled), node DP 114 is high and node DN 112 is low, thus turning off transistors MP1 118 and MN1 126 and placing the driver in a high-impedance state. When OE 104 is at logical high (or "1", enabled), the buffer is taken out of the high-impedance state and the output then depends of the state of the IN signal. If IN 102 is at logical low (or "0"), DP 114 and DN 122 are both low (or "0") and transistor MP1 118 is on while MN1 126 is off, causing the output node 106 to be pulled close to the supply voltage Vdd.

If IN 102 is at logical high (or "1") while OE 104 is at logical high (or "1", enabled), DP 114 and DN 122 are at both high (or "1") and transistor MP1 118 is turned off while MN1 126 is turned on, causing the output node 106 to be pulled close to the reference voltage (Gnd) 128.

The foregoing output buffer operates under the condition that a signal applied to the output node cannot substantially exceed the voltage of the supply voltage 120 (typically about +3.3 volt). If a signal applied to the output node does exceed the supply voltage, the channel end of p-channel transistor 118 connected to the output 106 has a voltage that is more positive than its gate voltage, which is close to the supply voltage, causing its channel to conduct from the output 106 back to the supply node 120. The higher voltage (such as 5 V) at the output forward biases the body diode of the p-channel transistor causing leakage currents and degradation of the buffer gate-oxide of the transistor, leading to reduced reliability.

The prior art buffer circuit of FIG. 2 attempts to overcome this problem. Referring to FIG. 2, the output buffer 200 includes a pair of p-channel pull-up transistors MP1, MP2, an n-channel pull-down transistor MN1, an enable transistor MN3, an inhibit transistor MP4, an OR and an AND gate.

The p-channel pull-up transistors MP1, MP3 have their channels connected in series between the voltage supply node Vdd and the output node 206. In particular, the transistor MP1 218 has its source and substrate connected to the voltage supply $V_{DD}$ 220 (typically at +3.3 volts) and its drain connected to node A 222. The transistor MP3 242 has its channel connected between the node A 222 and the output node 206. The transistor MP3 242 has its substrate coupled to the output node 206. The channel of the transistor MN1 228 is connected between the output node 206 and the reference voltage 244. The transistor MN3 238 has its channel connected between the gate 240 of transistor MP3 242 and the reference potential 244. The channel of the transistor MP4 236 is connected between the gate 240 of transistor MP3 242 and the output node 206, which also connects to the substrate of MP4.

The output of the AND gate 212 is connected to the gate of a pull-down transistor MN1 228 and the output of the OR gate 210, is connected to the gate 216 of a pull-up transistor MP1 218. The OE 204 signal input is connected to the gates 232, 234 of transistors MP4 236 and MN3 238. The OE 204 signal input also is connected to an active low input of an OR gate 210 and to an input of AND gate 212. The IN signal is connected to an active high input of the OR gate 210 and to the other input of the AND gate 212.

Compared to the output buffer 100 shown in FIG. 1, the output buffer 200 in FIG. 2 is includes the inhibiting circuit 230, which includes MP3, MP4, and MN3. When the output enable signal OE 204 is a logical low (or "0"), the transistor MN3 238 is off and the transistor MP4 236 is in a low-impedance state connecting the gate and the source of the transistor MP3 240. This forces transistor MP3 240 into a high-impedance state because MP3 has no source-to-gate voltage. If a voltage, such as 5 V, greater than the supply voltage Vdd is applied to node 206, a high impedance is presented to the output node 206 and current flow from the output node 206 back to the power supply 220 is inhibited for any signal exceeding the power supply voltage by about 2 to 3 volts. When the signal at OE 204 input is at logical high (or "1"), the transistor MP4 236 is non-conducting and the transistor MN3 238 is on. The drain of the transistor MN3 234 pulls down the gate of the transistor MP3 242, to a voltage near the reference voltage, thus turning on transistor MP3. Transistors MP1 216 and MN1 226 therefore, operate as in the conventional circuit, driving the output node 206 and presenting a low impedance.

However, in the output buffer 200 of FIG. 2, the transistors MP1 218 and MP3 240 are formed in different n-wells, leading to problems due to more occupied chip size and gate-oxide integrity.

Therefore, there is a need for an improved output buffer that can withstand signal from 0 to 5 V applied to its output, and overcome the problems related to gate-oxide integrity without increasing the chip size.

BRIEF SUMMARY OF THE INVENTION

A driver in accordance with the present invention includes (i) pull-up means, responsive to an output enable signal and an input data signal, for providing a low or high impedance path between a first supply voltage and an output node. The low impedance path is present when the output enable signal and the input data signal are both a logic high, the high impedance path is present when the either the output enable signal or the input data signal is a logic low, and the pull-up means is connected to a substrate bias voltage that is the greater of the output voltage when the pull-up means has a high-impedance path and the first supply voltage. The present invention further includes (ii) pull-down means, responsive to the output enable signal and the input data signal, for providing a low or high-impedance path between the output node and a second supply voltage. The low impedance path is present when the output enable signal is a logic high and the input data signal is a logic low, and the high impedance path is present when the output enable signal is a logic low or the input data signal is a logic high. The present invention further includes (iii) inhibit means, responsive to a voltage on the output node, for operating on the pull-up means to block conduction from the output node to the first supply voltage when the pull-up means provides a high impedance.

One advantage of the present invention is that the output buffer provides an output which is compatible with a 5-volt input signal at its output node while operating with a 3.3-volt power supply.

Another advantage of the present invention is that the problem of degradation of gate-oxide integrity reliability is overcome.

Yet another advantage is that the fabrication cost of the buffer is reduced by minimizing the on-chip area of the buffer.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
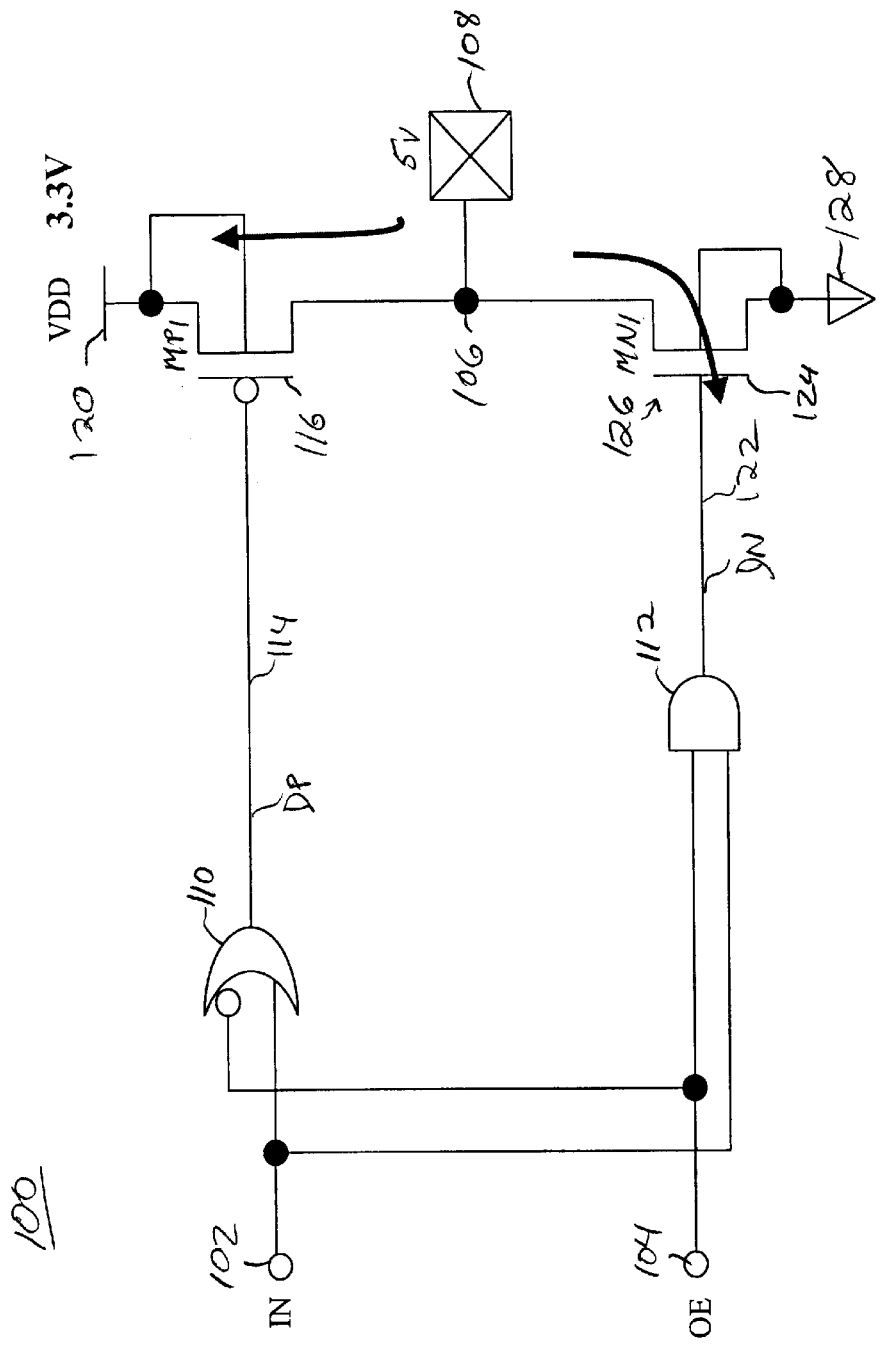
FIG. 1 is a circuit diagram showing a prior art output buffer.
Figure 2:
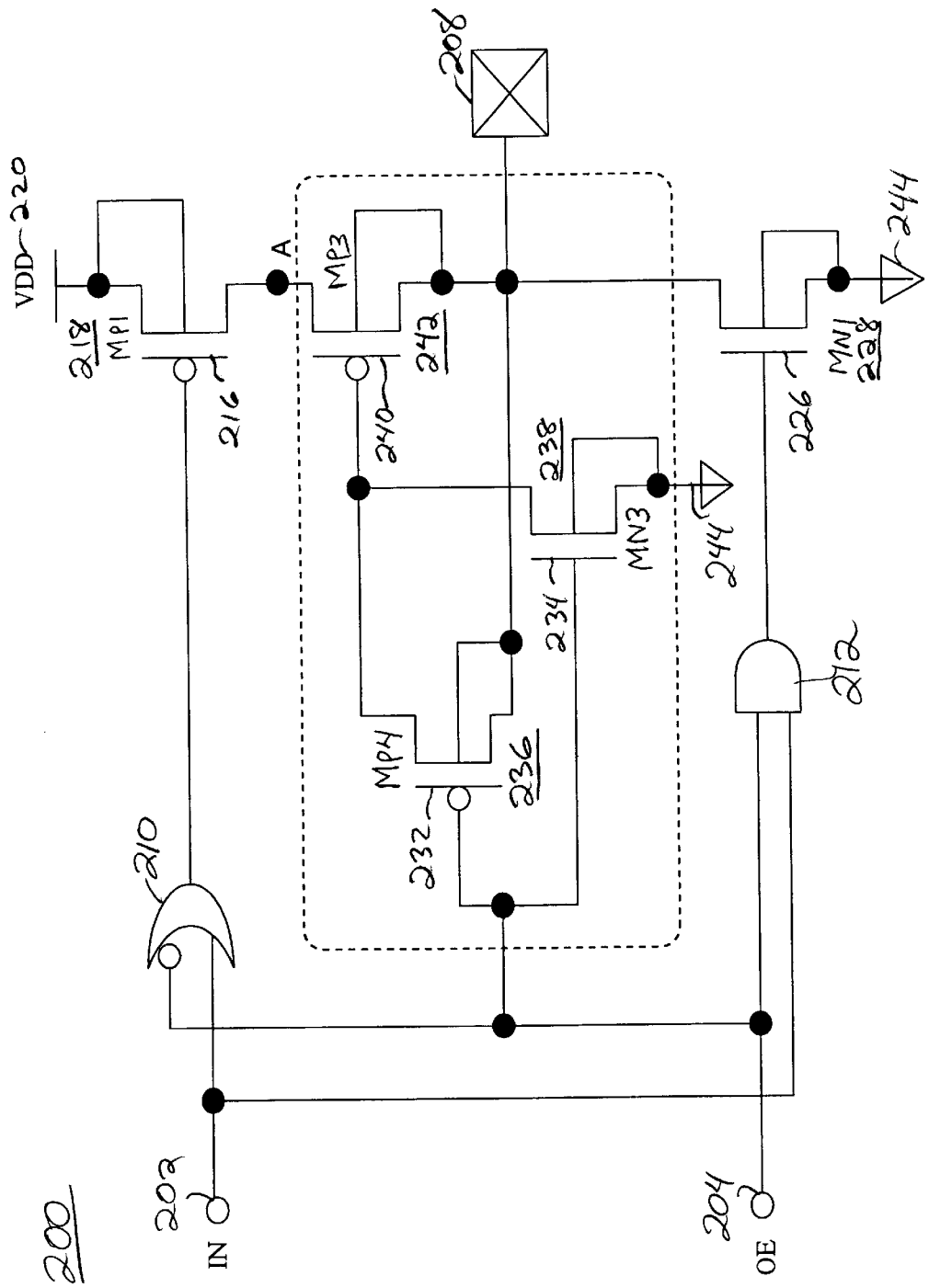
FIG. 2 is a circuit diagram showing another prior art output buffer.
Figure 3:
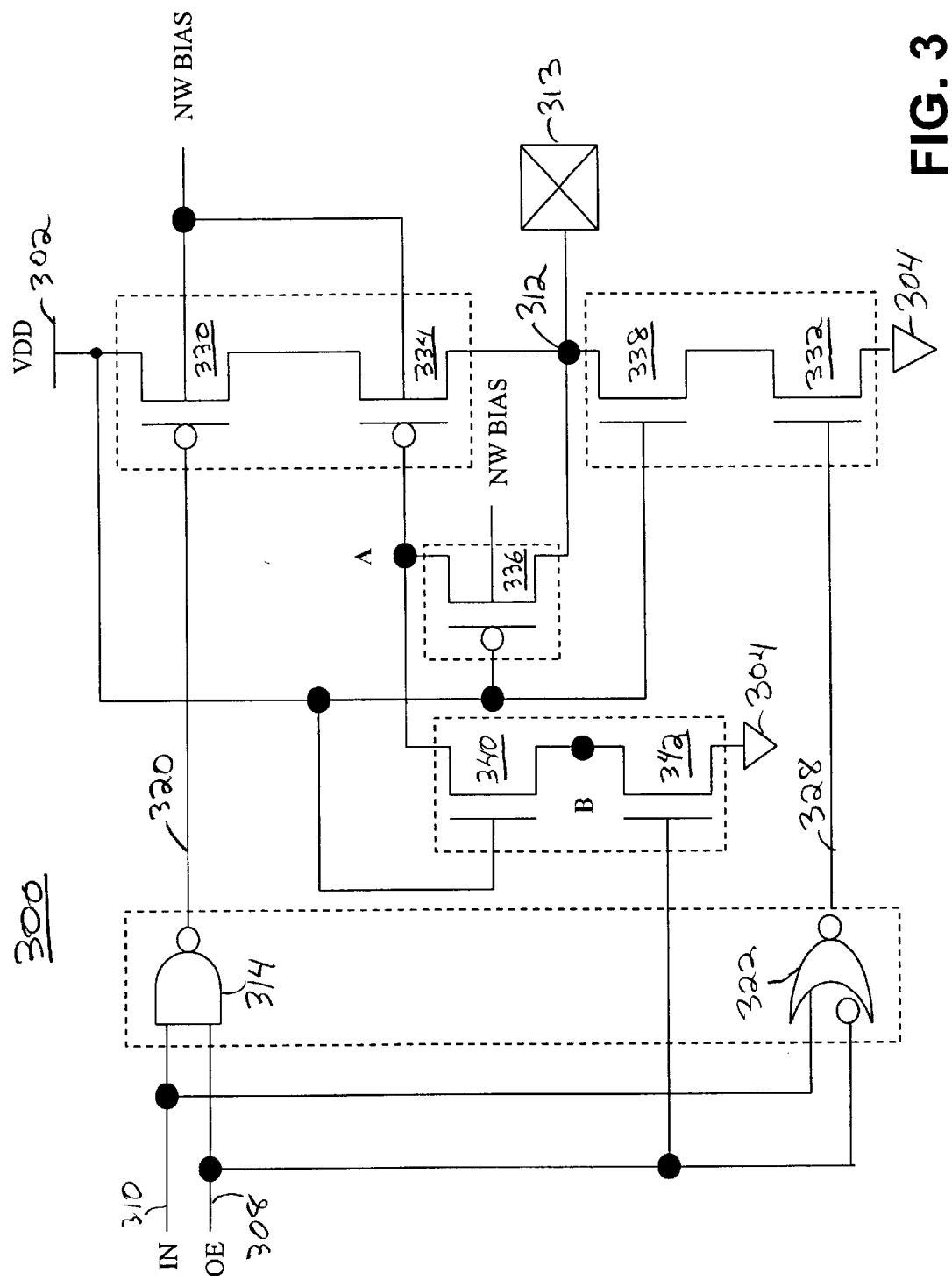
FIG. 3 is a circuit diagram showing an exemplary embodiment of a high voltage tolerant output buffer in accordance with the present invention.

FIG. 3 shows a circuit diagram of a high voltage tolerant output buffer 300, in accordance with the present invention. The buffer 300 includes, in one embodiment, a pair of p-channel pull-up transistors 330, 334, a pair of n-channel pull-down transistors 338, 332. a pair of n-channel enable transistors 340, 342, a p-channel inhibit transistor 336, a NAND gate 314 and a NOR gate 322.

The channels of each pull-up transistor 330, 334 are joined together at one end to connect the channels of the pair in series. The other end of the channel of the first pull-up transistor 330 is connected to the supply voltage Vdd 302 and the other end of the channel of the second pull-up transistor 334 is connected to the output node 312, which connects to pad 313.

The channels of each pull-down transistor 338, 332 are joined together at one end to connect the channels of the pair in series. The other end of the channel of first pull-down transistor 338 is connected to the output node 312 and the other end of the channel of the second pull-down transistor 332 is connected to the reference node (GND) 304. The gate of the first pull-down transistor 338 is connected to the supply voltage Vdd 302.

The channels of each enable transistor 340, 342 are joined together at one end to connect the channels of the pair in series. The other end of the channel of the first enable transistor 340 is connected to the gate of the second pull-up transistor 334 and the other end of the channel of second enable transistor 342 is connected to the reference node (GND) 304. The gate of the first enable transistor 340 is connected to the supply voltage Vdd 302.

The inhibit transistor 336 has its channel connected between the gate of second pull-up transistor 334 and the output node 312. The gate of the inhibit transistor is connected to the supply voltage Vdd 302. The substrate of the inhibit transistor 336 and the substrates of the pull-up transistors 330, 334 are all connected to a substrate bias voltage, NW BIAS 306.

The NAND gate 314 has an output 320 that is connected to the gate of the first pull-up transistor 330 and two inputs, one for receiving the input data signal IN 310 and the other for receiving the output enable signal OE 308.

The NOR gate 322 has an output 328 that is connected to the gate of the second pull-down transistor 332 and two inputs, an active high input for receiving the data input signal IN 310 and, an active low input for receiving the output enable signal OE 308.

The pull-up pair 330, 334 provides a low-impedance path between the supply voltage Vdd and the output node 312 when the gate of transistor 330 and the gate of transistor 334 are both low. The pull-up pair 330, 334 provides a high-impedance path when either the gate of transistor 334 or the gate of transistor 330 is high.

The pull-down pair 338, 332 provides a low impedance path between the output node 312 and the reference voltage 304 when the gate of transistor 332 is high and a high-impedance path when its gate is low.

The enable pair 340, 342 provides a low impedance path between the gate of the second pull-up transistor 334 and the reference voltage 304 when the gate of the second enable transistor 342 is high and a high impedance when that gate is low.

The inhibit transistor 336 is provides a low-impedance path between the output node 312 to which one end of the channel of transistor 334 is connected and the gate of transistor 334, when the voltage on the output node exceeds the supply voltage Vdd by approximately a p-channel threshold voltage, Vtp. Otherwise, the inhibit transistor 336 is non-conducting because neither end of its channel has a voltage higher than its gate voltage, which is the supply voltage Vdd.

The circuit of FIG. 3 operates as follows. When the output enable OE signal is a 'logic low' (a voltage near the reference voltage), the output of the NAND gate is a 'logic high' (a voltage near the supply voltage Vdd) and so is the gate of the first pull-up transistor 330. Also, under this condition, the enable pair 340 342, provide a high impedance between the gate of the second pull-up transistor 334 and the reference voltage 304. Thus, the pull-up pair provides a high impedance between the voltage supply Vdd 302 and the output node 312. Also, when the OE signal is a logic low, the pull-down pair 338, 332 has a high impedance because the gate of transistor 332 is low, because the output enable signal drives the output of the NOR gate 322 low. The inhibit transistor 336 is generally non-conducting unless a voltage greater than the supply voltage Vdd 302 is applied to the output node, while the output buffer is in the high-impedance state. If this occurs, then inhibit transistor 336 conducts to prevent a source-to-gate voltage from developing across second pull-up transistor 334. This guarantees that there is a high-impedance between the output node 312 and the supply voltage 302, even when the voltage on the output node exceeds the supply voltage.

When the output enable OE signal is a logic high, the enable pair 340, 342 presents a low impedance between the gate of the second pull-up transistor 334 and the reference potential 304, pulling the gate of transistor 334 low. This allows the pull-up pair to present a low or high impedance depending on the state of the input data signal 310. If the input data signal is a logic high, then the pull-up pair 330, 334 provides a low impedance between the supply voltage Vdd 302 and the output node 312 and the pull-down pair 338, 332 provides a high-impedance between the output node and the reference voltage 304. This causes the output node 312 to be pulled up to a voltage near to the supply voltage Vdd 302. If the input data signal is a logic low, the situation reverses, the pull-up pair provides a high impedance and the pull-down pair provides a low impedance, thereby pulling the output node down to the reference voltage. While the output enable signal is a logic high, the inhibit transistor has no effect on the output, because neither end of its channel can have a voltage higher than the gate voltage.

For the circuit of FIG. 3, it is useful to bias the n-well in which the p-channel transistors 330 334, 336 are formed so that the p-type source and drain regions do not become forward-biased with respect to the n-well. Therefore, a substrate bias voltage $V_F$ is applied to the substrates or bodies of the p-channel transistors 330, 334, 336. This voltage $V_F$ is generated, in one embodiment, by an n-well bias circuit 400 shown in FIG. 4.

Figure 4:
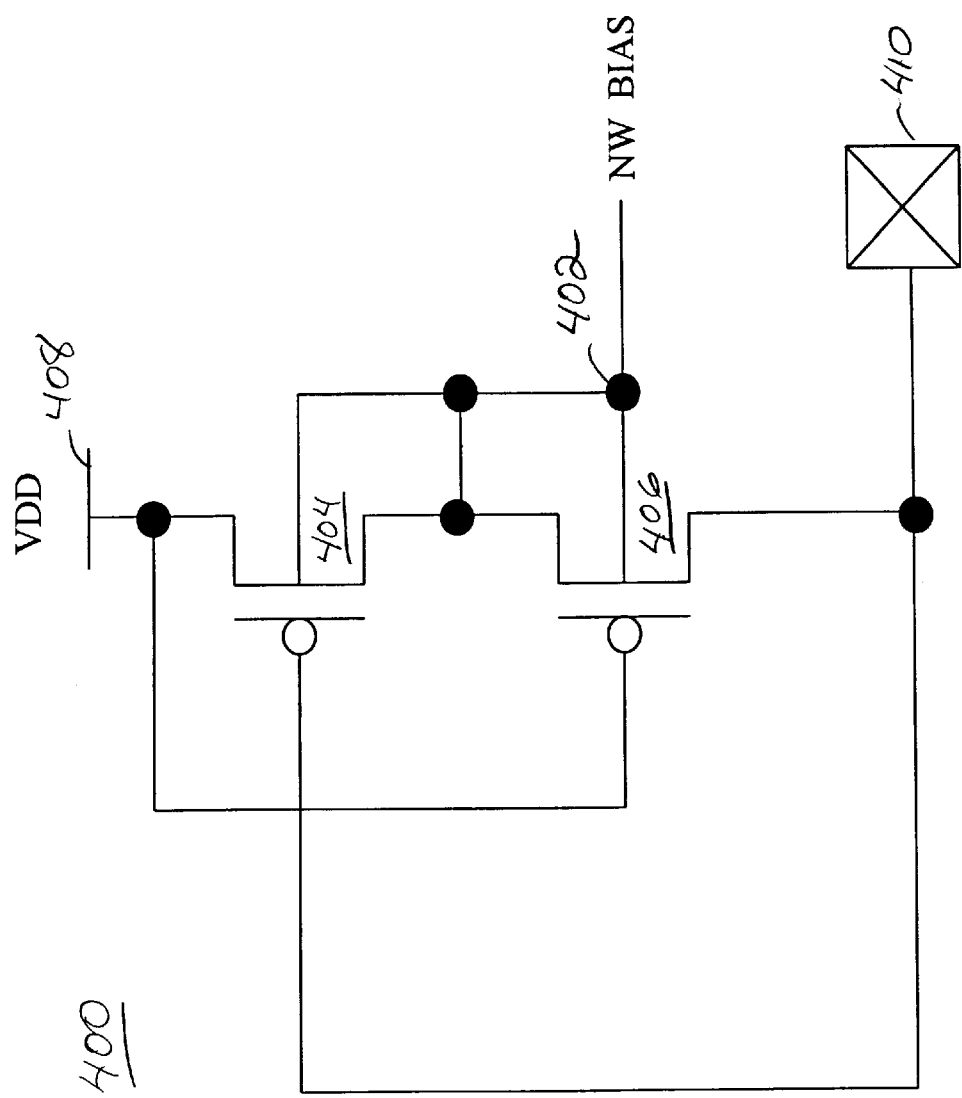
FIG. 4 is a circuit diagram showing an exemplary embodiment of the n-well bias circuit for the circuit of FIG. 3.

In FIG. 4, the n-well bias circuit 400 includes a pair of p-channel bias transistors 404, 406. The channels of the bias transistors are joined at one end 402 to connect the bias transistor channels in series. The other end of the first bias transistor 404 is connected to the supply voltage 408 and the other end of the second bias transistor 406 is connected to the output node 410, The gate of the first bias transistor 404 is connected to the supply voltage Vdd 408 and the gate of the second bias transistor 406 is connected to the output node 410. The substrates of each transistor are connected to the junction of the two channels of transistors 404, 406, the junction providing the substrate bias voltage $V_F$.

From this arrangement, transistor pair 404, 406 provides a bias voltage $V_F$ that is the larger of the output voltage or the supply voltage. If the supply voltage 408 is the larger voltage, then transistor 404 is conductive, thereby pulling the bias output node 402 close to the supply voltage. If the output voltage on node 410 is the larger voltage, then transistor 406 is conductive, thereby pulling the bias output node 402 close to the output node voltage. This maintains the substrates of transistors 404, 406, 330, 334, and 306 at the highest voltage in the circuit, when the circuit 400 of FIG. 4 is used as the bias voltage generator, which maintains a depletion region (and isolation) between the n-wells and the p-regions formed therein of the p-channel transistors.

Figure 5:
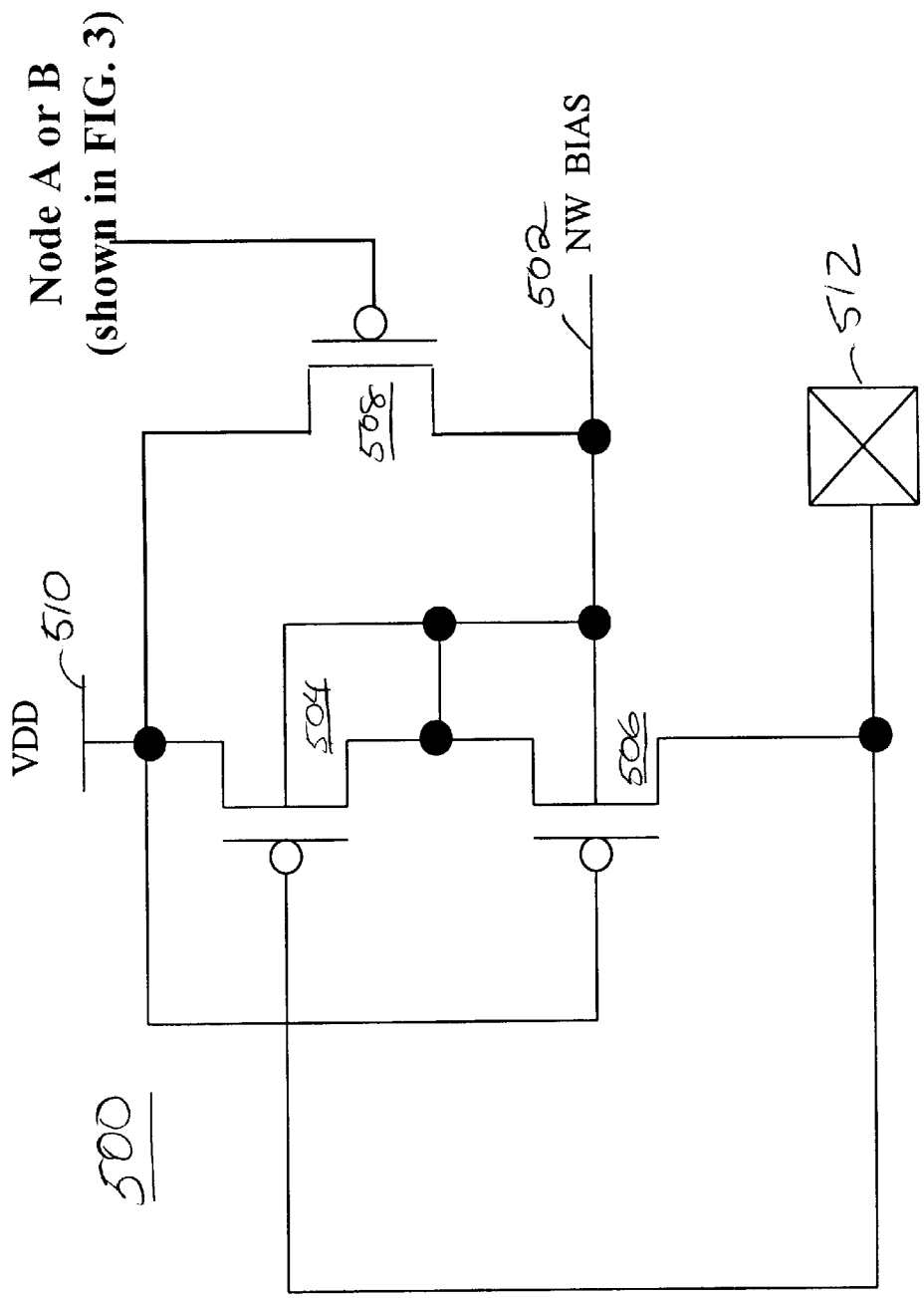
FIG. 5 is a circuit diagram showing another exemplary embodiment of the n-well bias circuit for the circuit of FIG. 3.

FIG. 5 shows an alternate embodiment of the n-well bias circuit in FIG. 4. Added to the circuit shown in FIG. 4 is a third bias transistor 508. The channel of the third bias transistor is connected between the supply voltage Vdd 510 and the bias voltage output node 502. The gate of the third bias transistor 508 connects to either the gate of the second pull-up transistor 334 or to the junction, node B, of the enable transistors, in FIG. 3. When connected to either the gate of the second pull-up transistor 334 or the junction of the enable transistors, transistor 508 operates to provide a lower resistance path between the supply voltage Vdd 510 and the bias output node 502, because the gate of transistor 508 is at a voltage closer to the reference voltage 304 than the gate of transistor 504.

According to the above discussion, the present invention discloses a high voltage tolerant output buffer, which is compatible with a 5-volt input signal at its output node while operating with a 3.3-volt power supply. The present invention overcomes the problems stemming from the degradation of gate-oxide integrity reliability and further reduces the fabrication cost by minimizing the chip size.

Although the present invention has been described in considerable detail with reference to certain preferred versions thereof, other versions are possible. Therefore, the spirit and scope of the appended claims should not be limited to the description of the preferred versions contained herein.

What is claimed is:

1. A driver having a high impedance state, the driver comprising:

pull-up means, responsive to an output enable signal and an input data signal, for providing a low or high impedance path between a first supply voltage and an output node, the low impedance path being present when the output enable signal and the input data signal are both a logic high, the high impedance path being present when the either the output enable signal or the input data signal is a logic low, and the pull-up means being connected to a substrate bias voltage that is the greater of the output voltage when the pull-up means has a high-impedance path and the first supply voltage;

pull-down means, responsive to the output enable signal and the input data signal, for providing a low or high-impedance path between the output node and a second supply voltage, the low impedance path being present when the output enable signal is a logic high and the input data signal is a logic low, and the high impedance path being present when the output enable signal is a logic low or the input data signal is a logic high; and inhibit means, responsive to a voltage on the output node, for operating on the pull-up means to block conduction from the output node to the first supply voltage when the pull-up means provides a high impedance.

2. A driver having a high impedance state, the driver comprising:

pull-up means, responsive to first and second control signals, for providing a low-impedance or high-impedance path between a first supply voltage and an output node, the low impedance path being present when first and second control signals are near a second supply voltage and the high impedance path being present when either first or second control signal is near the first supply voltage;

pull-down means, responsive to a third control signal, for providing a low-impedance or high-impedance path between the second supply voltage and the output node, the low impedance path being present when the third control signal is near a first supply voltage, and the high impedance path being present when the third control signal is near the second supply voltage;

enabling means, responsive to an output enable signal, for providing a low-impedance or high-impedance path between the second control signal and the second supply voltage, the low impedance path being present when the output enable signal is near the first supply voltage and the high impedance path being present when the output enable signal is near the second supply voltage;

inhibit means, responsive to a voltage on the output node, for providing a high-impedance or low-impedance path between the output node and the second control signal, the low impedance path being present when the output voltage is greater than the first supply voltage and there is a high impedance path provided by the enabling means, the high impedance path being present otherwise; and logic means, responsive to the output enable signal and an input data signal, for providing the first control signal and the third control signal.

3. A driver as recited in claim 2, wherein the pull-up means includes first and second p-channel pull-up transistors, each having a channel between drain and source nodes, a gate and a substrate, one node of the channels being joined together to connect the channels in series, the other node of the first pull-up channel being connected to the first supply voltage, the other node of the second pull-up channel being connected to the output node, the substrates being biased at a controlled bias voltage, the gate of the first pull-up transistor being connected to the first control signal, and the gate of the second pull-up transistor being connected to the second control signal.

4. A driver as recited in claim 2, further comprising means for providing the controlled bias voltage.

5. A driver as recited in claim 4, wherein the means for providing the controlled bias voltage includes a pair of p-channel bias transistors, each having a channel between drain and source nodes, a gate and a substrate, one node of the channels being joined together to connect the channels in series, the node at which the channels are joined providing the controlled substrate bias voltage, the other node of the first bias channel connected to the first supply voltage, the other node of the second bias channel connected to the output node, and the substrates connected to the controlled substrate bias voltage.

6. A driver as recited in claim 4, wherein the bias voltage providing means further includes a bias current switch transistor, having a channel between drain and source nodes, and a gate, one node of the channel being connected to the first supply voltage, the other node of the channel being connected to the node at which the channels of the bias transistors are joined, and the gate being connected to the second control signal.

7. A driver as recited in claim 4, wherein the providing means further includes a bias current switch transistor, having a channel between drain and source nodes, and a gate, one node of the channel being connected to the first supply voltage, the other node of the channel being connected to the node at which the channels of the bias transistors are joined, and the gate being connected to the node at which the channels of the enable transistors are joined.

8. A driver as recited in claim 2, wherein the pull-down means includes first and second n-channel transistors, each having a channel between drain and source nodes, and a gate, one node of the channels being joined together to connect the channels in series, the other node of the first pull-down channel being connected to the output node, the other node of the second pull-down channel being connected to a second supply voltage, the gate of the first n-channel transistor being connected to the first supply voltage, and the gate of the second n-channel transistor being connected to the third control signal.

9. A driver as recited in claim 2, wherein the enabling means includes first and second n-channel transistors, each having a channel between drain and source nodes, and a gate, one node of the channels being joined to together connect the channels in series, the other node of the first enable channel providing the second control signal, the other node of the second enable channel connected to the second supply node, the gate of the first enable transistor being connected to the first supply voltage, and the gate of the second enable transistor being connected to the output enable signal.

10. A driver as recited in claim 2, wherein the inhibit means includes a p-channel transistor having a channel between drain and source nodes, a gate and a substrate, the gate connected to the first supply node, the channel connected between the output node and the second control signal, and the substrate being biased at the controlled bias voltage.

11. A driver as recited in claim 10, further comprising means for providing the controlled bias voltage.

12. A driver as recited in claim 11, wherein the means for providing the controlled bias voltage includes a pair of p-channel bias transistors, each having a channel between drain and source nodes, a gate and a substrate, one node of the channels being joined together to connect the channels in series, the node at which the channels are joined providing the controlled substrate bias voltage, the other node of the first bias channel connected to the first supply voltage, the other node of the second bias channel connected to the output node, and the substrates connected to the controlled substrate bias voltage.

13. A driver as recited in claim 12, wherein the providing means further includes a bias current switch transistor, having a channel between drain and source nodes, and a gate, one node of the channel being connected to the first supply voltage, the other node of the channel being connected to the node at which the channels of the bias transistors are joined, and the gate being connected to the second control signal.

14. A driver as recited in claim 12, wherein the providing means further includes a bias current switch transistor, having a channel between drain and source nodes, and a gate, one node of the channel being connected to the first supply voltage, the other node of the channel being connected to the node at which the channels of the bias transistors are joined, and the gate being connected the node at which the channels of the enable transistors are joined.

15. A driver as recited in claim 2, wherein the logic means includes:

a two-input NAND gate having an output providing the first control signal, a first input for receiving the input data signal and a second input for receiving the output enable signal;

a two-input NOR gate having an output providing the third control signal, an active high input for receiving the input data signal, and an active low input for receiving the output enable signal.

16. A driver having a high impedance state, the driver comprising:

first and second p-channel pull-up transistors, each having a channel between drain and source nodes, a gate and a substrate, one node of the channels being joined together to connect the channels in series, the other node of the first pull-up channel being connected to a first supply voltage, the other node of the second pull-up channel being connected to an output node of the driver, and the substrates being biased at a controlled bias voltage;

first and second n-channel pull-down transistors, each having a channel between drain and source nodes, and a gate, one node of the channels being joined together to connect the channels in series, the other node of the first pull-down channel being connected to the output node, and the other node of the second pull-down channel being connected to a second supply voltage;

first and second n-channel enable transistors each having a channel between drain and source nodes, and a gate, one node of the channels being joined to together connect the channels in series, the other node of the first enable channel connected to the gate of the second pull-up transistor, the other node of the second enable channel connected to the second supply node, and the gate of the first enable transistor connected to the first supply node;

a p-channel inhibit transistor having a channel between drain and source nodes, a gate and a substrate, the gate connected to the first supply node, the channel connected between the output node and the gate of the second p-channel pull-up transistor, and the substrate being biased at the controlled bias voltage;

a NOR gate having an output connected to the gate of the second pull-down transistor, and an active-high input and an active-low input; and a NAND gate having an output connected to the gate of the first pull-up transistor, a first input connected to the active-low input of the NOR gate and the gate of the second enable transistor, the first input for receiving an output enable signal, and a second input connected to the active-high input of the NOR gate, the second input for receiving a logic input signal.

17. A driver as recited in claim 16, further comprising a pair of p-channel bias transistors, each having a channel between drain and source nodes, a gate and a substrate, one node of the channels being joined together to connect the channels in series, the node at which the channels are joined providing the controlled substrate bias voltage, the other node of the first bias channel connected to the first supply voltage, the other node of the second bias channel connected to the output node, and the substrates connected to the controlled substrate bias voltage.

18. A driver as recited in claim 17, further comprising a bias current switch transistor, having a channel between drain and source nodes, a gate, one node of the channel being connected to the first supply voltage, the other node of the channel being connected to the node at which the channels of the bias transistors are joined, the gate being connected to the gate of the second pull-up transistor.

19. A driver as recited in claim 17, further comprising a bias current switch transistor, having a channel between drain and source nodes, a gate, one node of the channel being connected to the first supply voltage, the other node of the channel being connected to the node at which the channels of the bias transistors are joined, the gate being connected to the node at which the channels of the enable transistors are joined.

* * * * *